United States Patent [19]

Imahashi

[11] Patent Number: 5,554,223

[45] Date of Patent: Sep. 10, 1996

[54] PLASMA PROCESSING APPARATUS WITH A ROTATING ELECTROMAGNETIC FIELD

[75] Inventor: Issei Imahashi, Yamanashi-ken, Japan

[73] Assignee: Tokyo Electron Limited, Tokyo, Japan

[21] Appl. No.: 205,798

[22] Filed: Mar. 4, 1994

[30] Foreign Application Priority Data

Mar. 6, 1993 [JP] Japan ................................. 5-071225

[51] Int. Cl.$^6$ ................................................ C23C 16/00
[52] U.S. Cl. ................. 118/723 I; 156/345; 204/298.06; 315/111.51
[58] Field of Search .......................... 118/723 AN, 723 I, 118/723 MP, 723 E; 156/345; 204/298.39, 298.06; 315/111.21, 111.41, 111.51, 111.71

[56] References Cited

U.S. PATENT DOCUMENTS

| | | | |
|---|---|---|---|
| 3,875,068 | 4/1975 | Mitzel . | |
| 4,115,184 | 9/1978 | Poulsen | 156/626 |
| 4,368,092 | 1/1983 | Steinberg et al. . | |
| 4,740,268 | 4/1988 | Bukhman | 156/643 |
| 4,792,732 | 12/1988 | O'Loughlin | 315/334 |
| 4,810,935 | 3/1989 | Boswell . | |
| 5,280,154 | 1/1994 | Cuomo | 219/121.52 |
| 5,330,606 | 7/1994 | Kubota | 156/345 |
| 5,332,880 | 7/1994 | Kubota | 219/121.52 |
| 5,404,079 | 4/1995 | Ohkuni | 315/111.81 |
| 5,430,355 | 7/1995 | Paranjpe | 315/111.21 |
| 5,436,424 | 7/1995 | Nakayama | 219/121.43 |
| 5,440,206 | 8/1995 | Kurono | 315/111.41 |
| 5,487,785 | 1/1996 | Horiike | 118/723 E |

FOREIGN PATENT DOCUMENTS 170684  7/1991  Japan ................................. 118/723 E

*Primary Examiner*—Robert Kunemund
*Assistant Examiner*—Jeffrie R. Lund
*Attorney, Agent, or Firm*—Oblon, Spivak, McClelland, Maier & Neustadt, P.C.

[57] ABSTRACT

A plasma process apparatus includes a high-vacuum container in which a semiconductor wafer is horizontally mounted on a susceptor, and into which a process gas such as an etching gas is supplied. Between the susceptor and the container a high-frequency voltage is applied. Around the outer periphery of the container, four high-frequency coils are arranged at given intervals in a circumferential direction. The coils apply a high-frequency power having phase difference of $\pi/2$ between the adjacent coils, into the container, so that a high-frequency rotating electromagnetic field rotating on a horizontal plane is formed in the container thereby generating a plasma of the process gas. The surface of the semiconductor wafer is processed by the plasma.

11 Claims, 2 Drawing Sheets

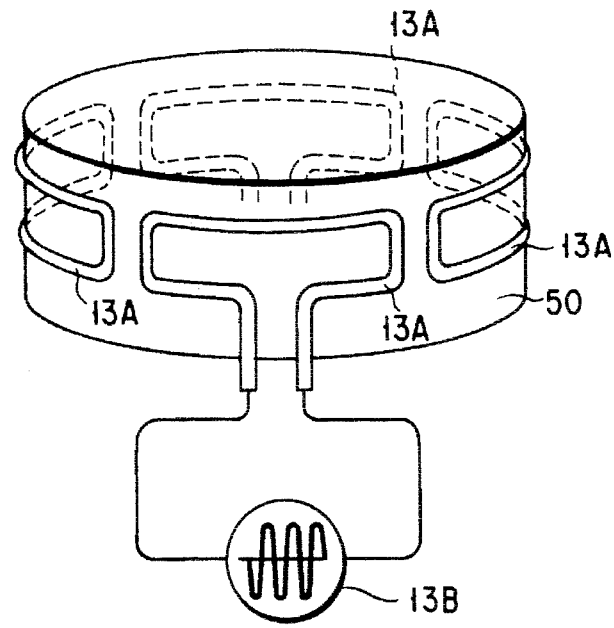
F I G. 3
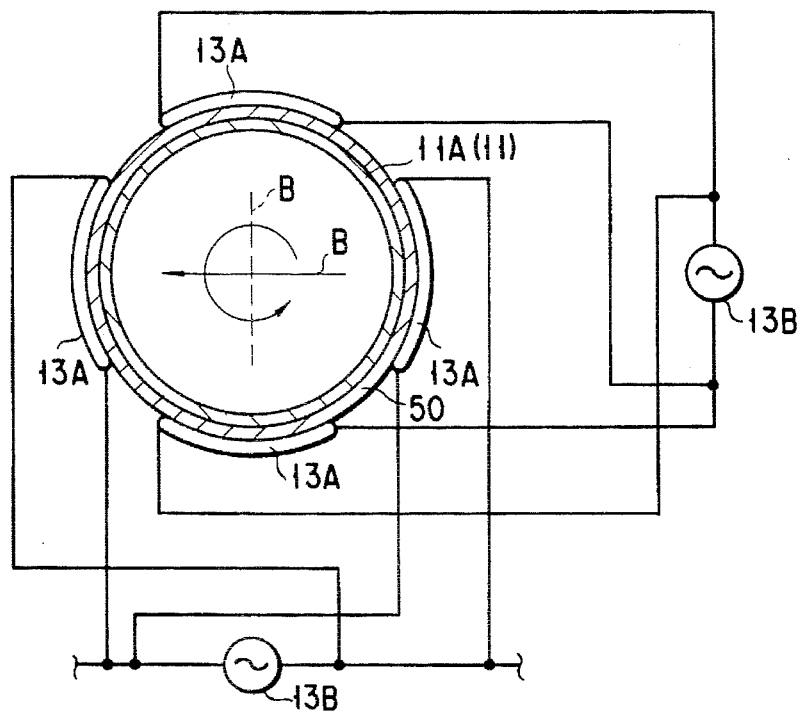
F I G. 4

5,554,223

PLASMA PROCESSING APPARATUS WITH A ROTATING ELECTROMAGNETIC FIELD

BACKGROUND OF THE INVENTION

1. Field of the Invention

The present invention relates to a plasma process apparatus used for a semiconductor manufacturing method such as a sputtering method, ashing method, CVD method, etching method, etc.

2. Description of the Related Art

A plasma process apparatus is constructed so that vacuum discharge is caused to generate plasma in a process container which contains a process gas, and an object to be processed is subjected to specified processes, such as film forming, ashing, etching, etc., by utilizing the plasma.

Conventionally known is a plasma process apparatus which is provided with parallel plate electrodes, for example. This apparatus comprises a process container in which a decompressed space is formed by evacuation, a lower electrode located in the lower part of the process container and holding a semiconductor wafer as an object to be processed, an upper electrode opposed to the lower electrode, and a high-frequency power source for applying a high-frequency voltage between the electrodes to generate plasma therebetween. A gas inlet port for receiving a process gas is formed in the upper surface of the upper electrode, while a number of gas supply holes, through which the received gas is fed into the process container, are formed dispersedly in the lower surface of the upper electrode. According to this arrangement, the gas for plasma process is fed through these gas supply holes into the process container, and after the process, the gas is discharged through an exhaust port from the container.

In subjecting the semiconductor wafer to plasma process by using the plasma process apparatus described above, the plasma process gas is fed through the gas supply ports into the process container, and the high-frequency voltage is applied between the upper and lower electrodes to generate the plasma by electrical discharge between them. The specified plasma process is carried out for the semiconductor wafer on the lower electrode with use of active seeds of the plasma.

In the case of the conventional plasma process apparatus having the parallel plate electrode structure described above, however, the plasma is generated by applying the high-frequency voltage to the upper and lower electrodes in the process container to cause the electrical discharge between the electrodes. Accordingly, the discharge gas pressure is restricted by the relationships between the discharge starting voltage, inter electrode distance, and gas pressure. A gas pressure of about 0.5 Torr is the upper limit of the degree of vacuum for stable generation of the plasma between the upper and lower electrodes, and the plasma cannot be generated in a higher vacuum. If the plasma process is effected under the gas pressure of this level, active seeds, such as ions, in the plasma run against the electrodes, thereby spattering thereon, so that impurities are generated from the electrodes. Thus, the semiconductor wafer is soiled by the impurities, and therefore, the yield is lowered. With the recent progress of superfine working technique, moreover, semiconductor wafers have come to require working in a high vacuum. However, the conventional plasma process apparatus cannot meet this requirement.

SUMMARY OF THE INVENTION

The object of the present invention is to provide a plasma process apparatus capable generating plasma even in a high vacuum in which a parallel plate electrode structure cannot generates plasma, and of subjecting an object of process, such as a semiconductor wafer, to uniform superfine working without soiling it.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a perspective view showing an example of a high-frequency magnetic field generator used in the apparatus shown in FIG. 1; and FIG. 4 is a perspective view showing a modification of the magnetic field generator.

DETAILED DESCRIPTION OF THE PREFERRED EMBODIMENT

An embodiment of the present invention will be described with reference to the drawings of FIGS. 1 and 2.

Figure 1:
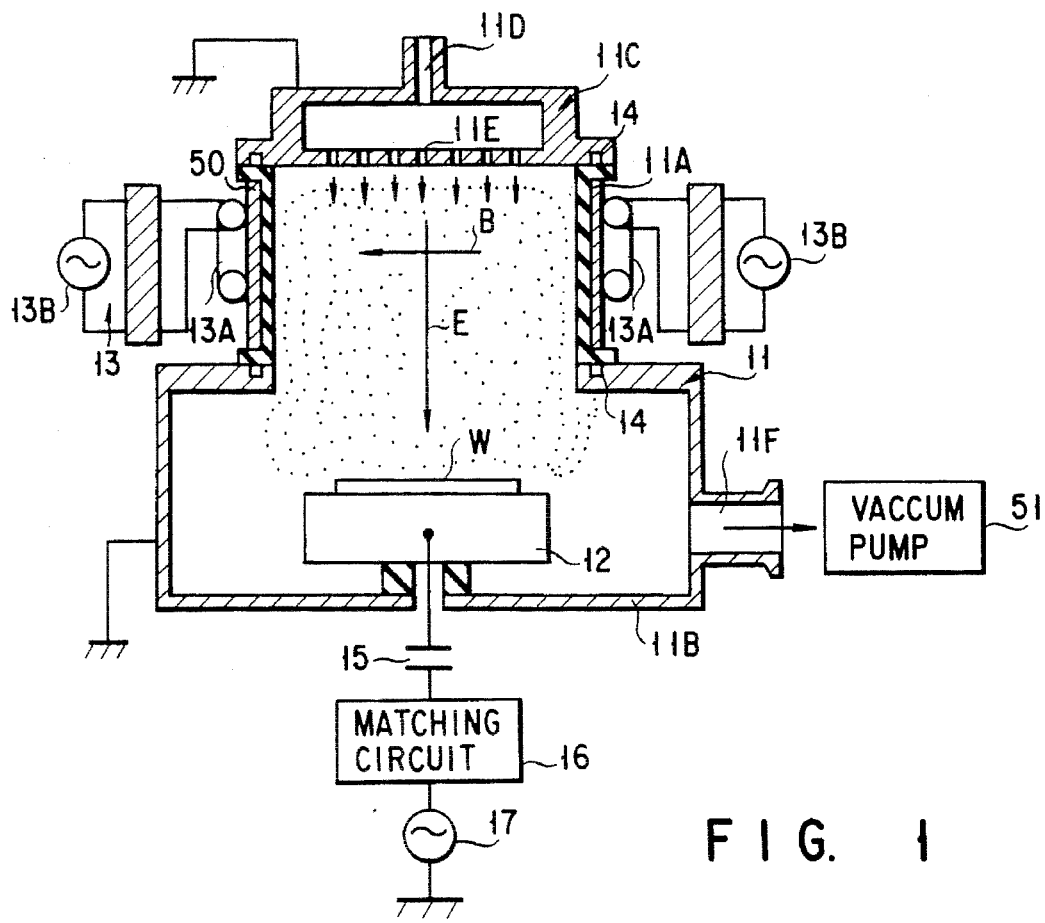
FIG. 1 is a sectional view showing an embodiment of a plasma process apparatus according to the present invention.
Figure 2:
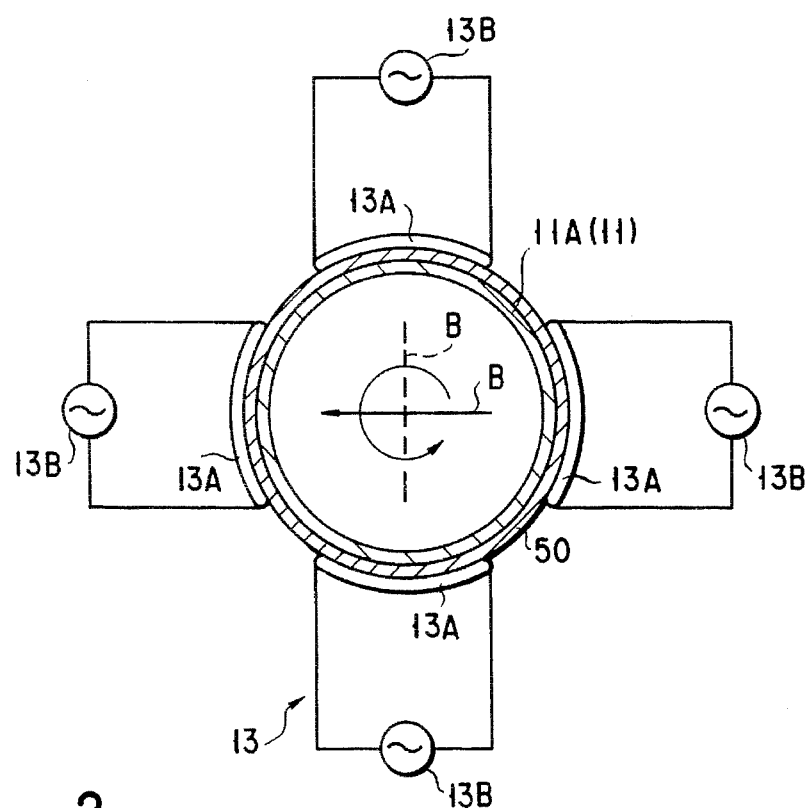
FIG. 2 is a horizontal sectional view showing the principal mechanism of the apparatus shown in FIG. 1.

As shown in FIGS. 1 and 2, a plasma process apparatus according to the present embodiment comprises a process container 11, defining therein a chamber which is hermetically sealed from the outside and can be kept in a high vacuum, and an electrically conductive susceptor 12, which is disposed in the process container and holds a semiconductor wafer W as an object to be processed in a horizontal position with its processed surface upward. The container 11 is surrounded by high-frequency plasma generating means 13, which generates a high-frequency rotating electromagnetic field with magnetic flux extending horizontally over the wafer, as indicated by arrow B, and oscillates electromagnetic waves in the magnetic field, thereby generating plasma in the process chamber. Preferably, the following individual members are arranged so that the central axis of the process container 11, the axis of rotation of the high-frequency rotating electromagnetic field, and the central axis of the semiconductor wafer w are in alignment with one another.

As shown in FIG. 1, the process container 11 is provided with an application section 11A for applying the high-frequency rotating electromagnetic field or induction field B and a process section 11B connected to the bottom portion of the section 11A. In the process section 11B, the semiconductor wafer W on the susceptor 12 is processed with the plasma from the electromagnetic field B. The application section 11A is composed of a cylindrical member which is formed of an insulating or dielectric material, such as quartz, ceramics, etc., and is open at both upper and lower ends thereof. The process section 11B is composed of a cylindrical member which is formed of an electrically conductive material, such as aluminum, and is closed at its lower end. A circular opening with a diameter substantially equal to the inside diameter of the application section 11A is formed in the center of the top wall of the process section 11B. The process section and the application section internally communicate with each other, thus defining the process chamber. A sealing member 14, such as an O-ring, is interposed between the top wall of the process section 11B and the lower end wall of the application section 11A so that the internal space is kept airtight. The inner surface of the process section 11B is treated with Alumite, and is grounded to maintain the ground potential. A gas supply section 11C for supplying a process gas is mounted on the upper end of the opening of the application section 11A with use of another sealing member 14, such as an O-ring, for airtightness. The gas supply section 11C is composed of a hollow flat disk which, like the process section 11B, is formed of an electrically conductive material, such as aluminum. A gas inlet port 11D is formed in the center of the top wall of the supply section 11C, while a number of gas supply holes 11E, through which the process gas from the inlet port 11D is fed into the process container 11, are formed dispersedly in the bottom wall of the section 11C. The number, dimension and/or distribution of the gas supply holes 11E may be selected according to the sort of process. The process section 11B is provided with an exhaust port (or exhaust pots arranged at given intervals in a circumferential direction) 11F which connects with external exhaust means or a vacuum pump 51, and the gas and the like are discharged from the process chamber through the port 11F after processing. The gas supply section 11C is grounded in the same manner as the process section 11B. The susceptor 12, like the process section 11B and the supply section 11C, is formed of aluminum treated with Alumite. The susceptor 12 is connected with a capacitor 15, a matching circuit 16, and a high-frequency power source 17 for applying a high-frequency voltage of, e.g., 13.56 MHz. In plasma process, the susceptor 12 is negatively biased by the high-frequency voltage. This bias voltage can be adjusted by suitably controlling the applied voltage from the high-frequency power source 17 in accordance with the contents of process of the semiconductor wafer W, so that the wafer W can enjoy a desired plasma process with use of this adjusted voltage.

The high-frequency plasma generating means 13 includes four coils or antennas 13A, which are arranged at given intervals in the circumferential direction so as to surround the application section 11A from the four quarters, and high-frequency power sources 13B for applying high-frequency voltages from hundreds of kilohertz to 100 MHz, e.g., at 13.56 MHz, to their corresponding coils 13A. The power sources 13B individually supply the coils 13A with high-frequency voltages $V\sin\omega t$, $V\sin(\omega t+\pi/2)$, $V\sin(\omega t+\pi)$ and $V\sin(\omega t+3\pi/2)$ (as named in order in the counterclockwise direction of FIG. 2, starting with the right-hand coil 13A) with a phase difference of $\pi/2$ between each two adjacent coils 13A, thereby forming the high-frequency rotating electromagnetic field B oscillated in synchronism with the high-frequency in the application section 11A. The coils 13A serve as antennas for oscillating electromagnetic waves or energy for the generation of plasma by utilizing power supplied from their corresponding high-frequency power sources 13B. The supplied power preferably ranges from 500 W to 3 kW, for example. Although each coil 13A should preferably be formed as a one- or two-turn coil lest its impedance be increased, it is not limited to this configuration. In this preferred embodiment, as shown in FIG. 3, each coil 13A is formed of a one-turn coil which is obtained by bending a metal wire along the outer surface of the application section 11A. Although a high-frequency power source 13B is connected to only one of the coils in FIG. 3, this is for simplicity of illustration. Actually, the high-frequency power sources are connected individually to the four coils. The coils 13A may be mounted directly on the outer surface of the application section 11A or arranged at a given distance therefrom. Preferably, a sheet 50, formed of, e.g., a ferrite-based material, should be interposed between the outer surface of the application section 11A and the coils 13A such that the section 11A can be prevented from being charged to cause electrostatic coupling. This destaticized sheet prevents the component of capacitance coupling of the electromagnetic waves from the antennas 13A from entering the container 11. Thus the inner surface of the container 11 does not charged in a negative potential. If the container is charged, material of the inner wall of the container should be inherently emitted in a plasma.

The high-frequency rotating electromagnetic field B, which is generated in a plasma generating region in the process chamber by the coils 13A, extends horizontally and at right angles to an electric field E formed between the susceptor 12 and the gas supply section 11C. By the action of the magnetic field rotating on a horizontal plane, the electromagnetic waves from the antennas 13A, and/or the electric field, the process gas is ionized to generate plasma, and the density of the plasma is increased. Even in a high vacuum of 0.005 Torr or less, therefore, a high-density homogeneous plasma can be generated from the process gas.

Since this plasma is generated with use of the horizontal rotating magnetic field B, there is no possibility of lines of magnetic force crossing the wafer, so that no eddy current is produced in the wafer. If an eddy current is produced in the wafer, an undesired electric current flows through the susceptor, possibly causing wire snapping and other troubles.

The following is a description of plasma process by means of the plasma process apparatus constructed in this manner.

First, the semiconductor wafer W is placed horizontally with its processed surface upward, on the susceptor 12 in the process container 11, and the interior of the container 11 is exhausted to a high vacuum, e.g., 0.005 Torr or less, through the exhaust port or ports 11F. As this exhaust is continued, thereafter, the process gas, such as en etching gas or film forming gas, is fed into the process container 11 through the gas supply ports 11E of the gas supply section 11C, and also, the high-frequency powers are applied to the coils 13A of the high-frequency plasma generating means 13. As a result, the high-frequency horizontal electromagnetic field B is generated in the process container 11, and besides, the electromagnetic waves are supplied to generate the plasma of the process gas. Since the high-frequency voltages from the individual coils 13A are subject to the phase difference of $\pi/2$ in the counterclockwise direction, the direction of application of the high-frequency electromagnetic field B gradually turns counterclockwise. Thus, the high-frequency electromagnetic field B which rotates in the application section 11A, that is, the high-frequency rotating electromagnetic field B, is formed. The plasma is homogenized by the agency of the electromagnetic field B and diffusion of plasma. Since electrons generated by the electromagnetic field is subjected to an E×B-drift, 17 is then more high density-plasma may be formed. The high-density homogeneous plasma thus formed covers the semiconductor wafer W on the susceptor 12, and ions in the plasma are drawn out toward the wafer W by the difference between the plasma potential and the self-bias potential of the susceptor 12. Thus, the semiconductor wafer W is subjected to a predetermined plasma process. Since the gas is continuously fed from the gas supply section 11C into the process container while the exhaust is continued, the process gas is successively supplied to the plasma, so that the plasma can maintain its homogeneity. Also, the generated plasma is fed downward to accelerate the plasma process.

According to the present embodiment, as described above, the high-frequency rotating electromagnetic field B is formed in the application section 11A of the process container 11, and the electromagnetic waves are supplied to generate the plasma, by means of the high-frequency plasma generating means 13 outside the container 11. In contrast with the conventional case, therefore, the plasma can be generated without being restricted by the length of the gap between the parallel plate electrodes, and even with the process container 11 in a high vacuum of, e.g., 0.005 Torr or less, which is extraordinarily smaller than the figure for the conventional arrangement. Thus, the plasma process can meet the demand for superfine working. Since no plasma generating electrode is located in the process container 11, there is no possibility of impurities being produced in the container 11 and soiling the semiconductor wafer W. According to the present embodiment, moreover, the electromagnetic field rotates during the process of the semiconductor wafer W, so that the plasma can always maintain its homogeneity, and therefore, the whole surface of the wafer w can enjoy the uniform plasma process. According to the present embodiment, furthermore, the application section 11A for applying the high-frequency rotating electromagnetic field B is formed of an insulating material such as quartz, so that the electromagnetic field B from the high-frequency plasma generating means 13 can be formed satisfactorily in the application section 11A without being screened thereby. Thus, the plasma can be kept homogeneous. Since the other portions of the process container 11 than the application section 11A are formed of an electrically conductive material such as aluminum, moreover, they cannot be charged, so that safety and high workability can be secured. Also, the lines of magnetic force extend parallel to the processed surface of the semiconductor wafer W without crossing it in the high-frequency rotating electromagnetic field B, so that no substantial eddy current can be produced in the wafer.

In the high-frequency plasma generating means 13 described in connection with the above embodiment, the high-frequency power sources 13B are connected individually to the four coils 13A. Alternatively, however, high-frequency voltages with a phase difference of 180° may be applied individually to a pair of coils 13A which are arranged at an angular distance of 180°. Although no rotating magnetic field is formed in the application section 11A, in this arrangement, a horizontally oscillating magnetic field is formed such that plasma can be generated in the same manner as in the rotating magnetic field. In this case, a common high-frequency power source can be used for the coils if the coils are wound in opposite directions. As shown in FIG. 4, moreover, an arrangement may be such that a pair of opposite coils 13A, out of the four coils, are connected to one high-frequency power source 13B, and another pair of coils 13A are connected to another high-frequency power source 13B so that a high-frequency rotating electromagnetic field is generated by driving the two power sources with the same frequency and a phase difference of $\pi/2$. As described above, the high-frequency plasma generating means used in the apparatus according to the present invention, may be any one which can form an electromagnetic field capable of high-speed movement, such as rotation or vibration, within a plane substantially parallel to the processed surface of the semiconductor wafer. For example, the plasma generating means may be arranged so that high-frequency voltages with a phase difference of $2\pi/3$ are applied individually to three coils which are arranged at intervals of 120°, and a high-frequency rotating electromagnetic field is generated by means of these coils. The coils may be four or more in number.

The vertical process container is used according to the embodiment described herein. Since the object to be processed need not always be supported in a horizontal position, however, a horizontal process container may, for example, be used such that the object is supported in a substantially vertical position as it is processed. In these process containers, a plurality of objects to be processed may be contained and processed simultaneously.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma process apparatus comprising:

a process container having a peripheral wall, an upper end wall, a lower end wall, and a process chamber surrounded by the walls;

means for supporting an object to be processed having a processed surface in the process chamber;

means for feeding a process gas into the process chamber; and induction means arranged outside the process container and applying a high-frequency power to form in the process chamber an induction field rotating in synchronism with the high-frequency power along a plane substantially parallel to the processed surface and to supply electromagnetic waves, thereby generating a plasma of the process gas, when a high-frequency voltage is applied thereto.

2. A plasma process apparatus according to claim 1, wherein said supporting means includes a susceptor for supporting the object to be processed so that the one end of the process container and the processed surface face each other, and said induction means includes a plurality of high-frequency coils arranged at intervals along the peripheral wall of the process container and power supply means for applying high-frequency voltages of different phases to the high-frequency coils.

3. A plasma process apparatus according to claim 1, wherein said supporting means includes a susceptor for supporting the object to be processed so that the one end of the process container and the processed surface face each other, and said induction means includes at least three high-frequency coils arranged at intervals along the peripheral wall of the process container and power supply means for applying high-frequency voltages with a phase difference of $2\pi$ per coil number to the high-frequency coils, individually, therein forming a rotating electromagnetic field in the process chamber.

4. A plasma process apparatus according to claim 1, wherein said supporting means includes a susceptor for supporting the object to be processed so that the one end of the process container and the processed surface face each other, and said induction means includes two high-frequency coils arranged opposite to each other along the peripheral wall of the process container and power supply means for applying high-frequency voltages with a phase difference of 180° to the high-frequency coils, individually.

5. A plasma process apparatus according to claim 1, which further comprises means for forming a high-frequency electric field perpendicular to said plane.

6. A plasma process apparatus according to claim 1, further comprising:

means for generating a horizontal magnetic field in a plasma generating region, said plasma generating region being defined between the object to be processed and the upper end wall; and means for generating a vertical electric field in the plasma generating region and generating, in conjunction with the horizontal magnetic field, a plasma of the process gas in the plasma generating region, wherein said supporting means includes a susceptor for supporting the object to be processed so that the one end of the process container and the processed surface face each other, said induction means includes a plurality of high-frequency coils arranged at intervals outside and along said peripheral wall of the process container and power supply means for applying high-frequency voltages of different phases to the high-frequency coils, and said vertical electric field generating means includes means for applying a high-frequency electric voltage between the susceptor and the upper end wall.

7. A plasma process apparatus according to claim 6, wherein said upper and lower end walls are formed of an electrical conductor, said peripheral wall includes an upper portion defining the plasma generating region and made of a dielectric material and a lower portion situated between the upper portion and the lower end wall and formed of an electrical conductor, and said plurality of high-frequency coils are arranged along the outer periphery of the upper portion.

8. A plasma process apparatus according to claim 7, wherein said high-frequency electric field applying means includes means for grounding the upper end wall and applying a negative voltage to the susceptor.

9. A plasma process apparatus comprising:

a process container containing at least one object to be processed having a processed surface;

induction means adapted to form in the process container an electromagnetic field rotating along a plane substantially parallel to the processed surface and to supply electromagnetic waves, therein generating plasma of the process gas, when a high-frequency voltage is applied thereto; and means for reducing the pressure in the process container to 0.005 Tort during processing.

10. A plasma process apparatus according to claim 9, wherein said process container has a peripheral wall formed of a dielectric, and said induction means includes a plurality of high-frequency coils arranged around and along the peripheral wall, and which further comprises a destaticized sheet interposed between the high-frequency coils and the peripheral wall.

11. A plasma process apparatus according to claim 9, wherein said induction means further comprises a plurality of high-frequency coils arranged around and along the peripheral wall, and a destaticized sheet interposed between the high-frequency coils and the peripheral wall, wherein each said high-frequency coil is a coil bent so as to extend along the peripheral wall.

\* \* \* \* \*